United States Patent
Peace et al.

(10) Patent No.: US 6,492,284 B2
(45) Date of Patent: Dec. 10, 2002

(54) REACTOR FOR PROCESSING A WORKPIECE USING SONIC ENERGY

(75) Inventors: Steven L. Peace, Whitefish, MT (US); Paul Z. Wirth, Whitefish, MT (US); Eric Lund, Kent, WA (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/907,552

(22) Filed: Jul. 16, 2001

(65) Prior Publication Data

US 2002/0066471 A1 Jun. 6, 2002

Related U.S. Application Data

(63) Continuation-in-part of application No. 09/437,711, filed on Nov. 10, 1999, which is a continuation-in-part of application No. PCT/US99/05676, filed on Mar. 15, 1999.
(60) Provisional application No. 60/116,750, filed on Jan. 22, 1999.

(51) Int. Cl.[7] .................. H01L 23/48; H01L 23/52; H01L 29/40
(52) U.S. Cl. ............ 438/782; 438/694; 438/782; 438/913; 134/33; 134/34; 118/323; 118/722
(58) Field of Search .............. 438/694, 780–782, 438/906, 913; 134/1–10, 33–34, 182–184; 118/722, 323; 417/271; 414/935–941

(56) References Cited

U.S. PATENT DOCUMENTS

| 3,727,620 A | 4/1973 | Orr |
|---|---|---|
| 3,953,265 A | 4/1976 | Hood |
| 4,132,567 A | 1/1979 | Blackwood |
| 4,439,243 A | 3/1984 | Titus |
| 4,439,244 A | 3/1984 | Allevato |
| 4,544,446 A | 10/1985 | Cady |
| 4,664,133 A | 5/1987 | Silvernail et al. |
| 4,750,505 A | 6/1988 | Inuta et al. |
| 4,790,262 A | 12/1988 | Nakayama et al. |
| 4,838,289 A | 6/1989 | Kottman et al. |
| 4,903,717 A | 2/1990 | Sumnitsch |
| 4,982,215 A | 1/1991 | Matsuoka |
| 4,982,753 A | 1/1991 | Grebinski, Jr. et al. |
| 5,020,200 A | 6/1991 | Mimasaka |
| 5,032,217 A | 7/1991 | Tanaka |
| 5,037,371 A | * 8/1991 | Romanauskas ............ 494/10 |
| 5,117,769 A | 6/1992 | DeBoer |
| 5,168,886 A | 12/1992 | Thompson et al. |
| 5,209,180 A | 5/1993 | Shoda et al. |
| 5,222,310 A | 6/1993 | Thompson et al. |
| 5,224,503 A | 7/1993 | Thompson et al. |

(List continued on next page.)

FOREIGN PATENT DOCUMENTS

| JP | 59-208831 | 11/1984 |
|---|---|---|
| JP | 60-137016 | 7/1985 |
| JP | 661-196534 | 8/1986 |

(List continued on next page.)

OTHER PUBLICATIONS

Field, Leslie et al. "Fluid–powered rotary gears and micro-flow channels" IEEE 91ch2817–5/91/0000–1033 p. 1033–1036.*

Primary Examiner—Matthew Smith
Assistant Examiner—Granvill D Lee, Jr.
(74) Attorney, Agent, or Firm—Perkins Coie LLP

(57) ABSTRACT

A system for processing a workpiece includes a base having a bowl or recess for holding a liquid. A process reactor or head holds a workpiece between an upper rotor and a lower rotor. A head lifter lowers the head holding the workpiece into contact with the liquid. Sonic energy is introduced into the liquid and acts on the workpiece to improve processing. The head spins the workpiece during or after contact with the liquid. The upper and lower rotors have side openings for loading and unloading a workpiece into the head. The rotors are axially moveable to align the side openings.

29 Claims, 2 Drawing Sheets

U.S. PATENT DOCUMENTS

| | | | |
|---|---|---|---|
| 5,224,504 A | | 7/1993 | Thompson et al. |
| 5,279,316 A | * | 1/1994 | Miranda .................. 134/102.1 |
| 5,337,446 A | * | 8/1994 | Smith et al. .................. 15/21.1 |
| 5,349,978 A | | 9/1994 | Sago et al. |
| 5,361,449 A | | 11/1994 | Akimoto |
| 5,421,893 A | | 6/1995 | Perlov |
| 5,431,421 A | | 7/1995 | Thompson et al. |
| 5,445,172 A | | 8/1995 | Thompson et al. |
| 5,513,594 A | | 5/1996 | McClanahan et al. |
| 5,551,986 A | | 9/1996 | Jain |
| 5,579,792 A | * | 12/1996 | Stanasolovich et al. ..... 134/184 |
| 5,591,262 A | | 1/1997 | Sago et al. |
| 5,616,069 A | | 4/1997 | Walker et al. |
| 5,658,387 A | * | 8/1997 | Reardon et al. ............. 118/323 |
| 5,666,985 A | | 9/1997 | Smith, Jr. et al. |
| 5,677,824 A | | 10/1997 | Harashima et al. |
| 5,678,116 A | | 10/1997 | Sugimoto et al. |
| 5,718,763 A | | 2/1998 | Tateyama et al. |
| 5,762,084 A | * | 6/1998 | Krusell et al. .............. 134/184 |
| 5,762,708 A | | 6/1998 | Motoda et al. |
| 5,762,751 A | | 6/1998 | Bleck et al. |
| 5,779,796 A | | 7/1998 | Tomoeda et al. |
| 5,815,762 A | | 9/1998 | Sakai et al. |
| 5,845,662 A | | 12/1998 | Sumnitsch |
| 5,860,640 A | | 1/1999 | Marohl et al. |
| 5,868,866 A | | 2/1999 | Maekawa et al. |
| 5,882,433 A | | 3/1999 | Ueno |
| 5,885,755 A | | 3/1999 | Nakagawa et al. |
| 5,916,366 A | | 6/1999 | Ueyama et al. |
| 5,942,035 A | | 8/1999 | Hasebe et al. |
| 5,972,127 A | * | 10/1999 | Thompson et al. ............ 134/33 |
| 5,997,653 A | | 12/1999 | Yamasaka |
| 6,066,575 A | * | 5/2000 | Reardon et al. ............. 438/782 |
| 6,098,643 A | * | 8/2000 | Miranda ..................... 134/186 |
| 6,124,207 A | * | 9/2000 | Robinson et al. ........... 438/692 |
| 6,181,051 B1 | * | 1/2001 | Puskas .................. 310/316.01 |
| 6,200,387 B1 | * | 3/2001 | Ni ............................... 118/722 |
| 6,350,319 B1 | * | 2/2002 | Curtis et al. ................ 118/715 |

FOREIGN PATENT DOCUMENTS

| | | |
|---|---|---|
| JP | 62-166515 | 7/1987 |
| JP | 63-185029 | 7/1988 |
| JP | 1-120023 | 5/1989 |
| JP | 4 94537 | 3/1992 |
| JP | 5-13322 | 1/1993 |
| JP | 5-21332 | 1/1993 |
| JP | 5-326483 | 12/1993 |
| JP | 6-45302 | 2/1994 |
| JP | 52-12576 | 1/1997 |
| JP | 1-283845 | 11/1999 |
| WO | WO99/46065 | 9/1999 |

* cited by examiner

REACTOR FOR PROCESSING A WORKPIECE USING SONIC ENERGY

This application is a Continuation-In-Part of: U.S. patent application Ser. No. 09/437,711, filed Nov. 10, 1999 and now pending, which is a Continuation-In-Part/U.S. National Phase of International Patent Application No. PCT/US99/05676, filed Mar. 15, 1999, and now pending; which is a Continuation-In-Part of U.S. Patent Application Serial No. 60/116,750 filed Jan. 22, 1999, and now abandoned. Priority to these applications is claimed and these applications are incorporated herein by reference. This application also incorporates by reference U.S. patent application Ser. Nos. 09/907,484, 09/907,524 and 09/907,522, filed on Jul. 16, 2001.

The invention relates to surface preparation, cleaning, rinsing and drying of workpieces, such as semiconductor wafers, flat panel displays, rigid disk or optical media, thin film heads, or other workpieces formed from a substrate on which microelectronic circuits, data storage elements or layers, or micro-mechanical elements may be formed. These and similar articles are collectively referred to here as a "wafer" or "workpiece".

BACKGROUND OF THE INVENTION

The semiconductor manufacturing industry is constantly seeking to improve the processes used to manufacture microelectronic circuits and components, such as the manufacture of integrated circuits from wafers. The objectives of many of these improved processes are decreasing the amount of time required to process a wafer to form the desired integrated circuits; increasing the yield of usable integrated circuits per wafer by, for example, decreasing contamination of the wafer during processing; reducing the number of steps required to create the desired integrated circuits; and reducing the costs of manufacture.

In the processing of wafers, it is often necessary to subject one or more sides of the wafer to a fluid in either liquid, vapor or gaseous form. Such fluids are used to, for example, etch the wafer surface, clean the wafer surface, dry the wafer surface, passivate the wafer surface, deposit films on the wafer surface, etc. Controlling how the processing fluids are applied to the wafer surfaces, is often important to the success of the processing operations.

Various machines and methods have been used for carrying out these manufacturing processes. However, existing machines have several disadvantages. These disadvantages include relatively large consumption of process chemicals and water. This consumption of process chemicals increases manufacturing costs, which ultimately increases the cost of the final product, such as e.g., computers, cell phones, and virtually all types of consumer, industrial, commercial and military electronic products. In addition, many process chemicals are toxic and require special handling, storage, and disposal methods. These can be costly and difficult, but are necessary for health, safety and environmental reasons. Consequently, reducing consumption of process chemicals has many advantages.

Reducing consumption of water is also beneficial. In many areas, water is becoming increasingly scarce. Due to population growth, there is greater competition for water. Disposing of waste water in environmentally friendly ways has also often become more difficult or costly. Accordingly, reducing water consumption in the manufacturing process is also important.

In many process manufacturing steps, the process chemicals used should be applied evenly onto the wafers, to avoid having too much or too little etching, film removal, etc. Existing machines often are not able to sufficiently uniformly apply process chemicals. This can result in lower yields. Moreover, many existing machines try to compensate for variations in applying process chemicals by using larger amounts of process chemicals. This inefficient use of process chemicals leads to the disadvantages described above. Accordingly, improved machines and methods which provide improved yield, consume less process chemicals and water, and offer better results in performing manufacturing operations, are needed.

Manufacturing semiconductor and similar products on a commercial scale requires a fab or manufacturing facility often costing hundreds of million dollars to build and equip. Operating and maintenance costs are also very high. Consequently, the output or yield of the fab is critical to successful operations. Faster processing can help increase the fab output. While conventional processing with liquids may produce the desired results, it can be time consuming. Accordingly, faster process methods and machines are very advantageous.

SUMMARY OF THE INVENTION

Machines and methods have now been invented which overcome the disadvantages described above. In one design, the machine includes a workpiece housing having a processing chamber. Processing fluids are distributed across the surface of the workpiece in the processing chamber, by centrifugal force.

In a preferred design, a process head holds a workpiece with the bottom of the workpiece uncovered or open. A base has a bowl for containing a liquid. A sonic energy source, such as a megasonic transducer, is associated with the bowl. The head moves to place the workpiece into contact with the liquid in the bowl. Sonic energy from the sonic energy source moves through the liquid to the workpiece, improving workpiece processing. The process head optionally rotates the workpiece while it is in contact with the liquid.

The use of sonic energy in these aspects expedites processing and provides more efficient processing. The use of sonic energy with reactors, such as described in International Patent Application No. WO 99/46064, (published Sep. 16, 1999 and incorporated herein by reference) which are currently in use is generally counter-intuitive, due to the often closed configuration; spinning rotors; and/or lack of a continuous liquid volume around the workpiece, in these reactors. It has now been discovered, however, that sonic energy can indeed be used in these types of reactors, providing improved processing.

Accordingly, it is an object of the invention to provide improved methods and apparatus for processing a workpiece. The invention resides as well in subcombinations of the steps and features described. The features described and illustrated in connection with one embodiment may or course be used in other embodiments as well.

BRIEF DESCRIPTION OF THE DRAWINGS

In the drawings, the same element number is used to designate the same element in all of the views.

DETAILED DESCRIPTION OF THE INVENTION

Figure 1:
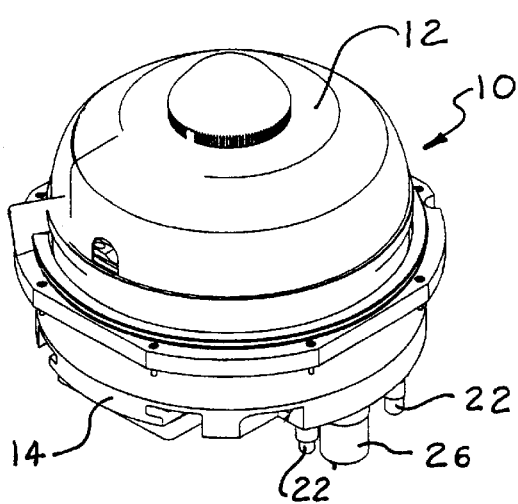
FIG. 1 is a perspective view of a process system using sonic energy.

A processing system 10 using sonic energy, as shown in FIGS. 1–4 has a process head 12 and a base 14. The head 12 has an upper rotor 38 which engages with a lower rotor 36 to hold a workpiece 25 between them. A motor 50 rotates the rotors. A bellows 40 attached to the upper and lower rotors helps to keep process chemicals out of the internal components of the head 12. Workpieces may be loaded and unloaded into and out of the head through a side opening 42, when the head is in a load/unload position. An upper nozzle 46 introduces a process fluid onto the top surface of the workpiece. The head 12 is described in U.S. patent application Ser. No. 09/907,522, incorporated herein by reference.

Figure 4:
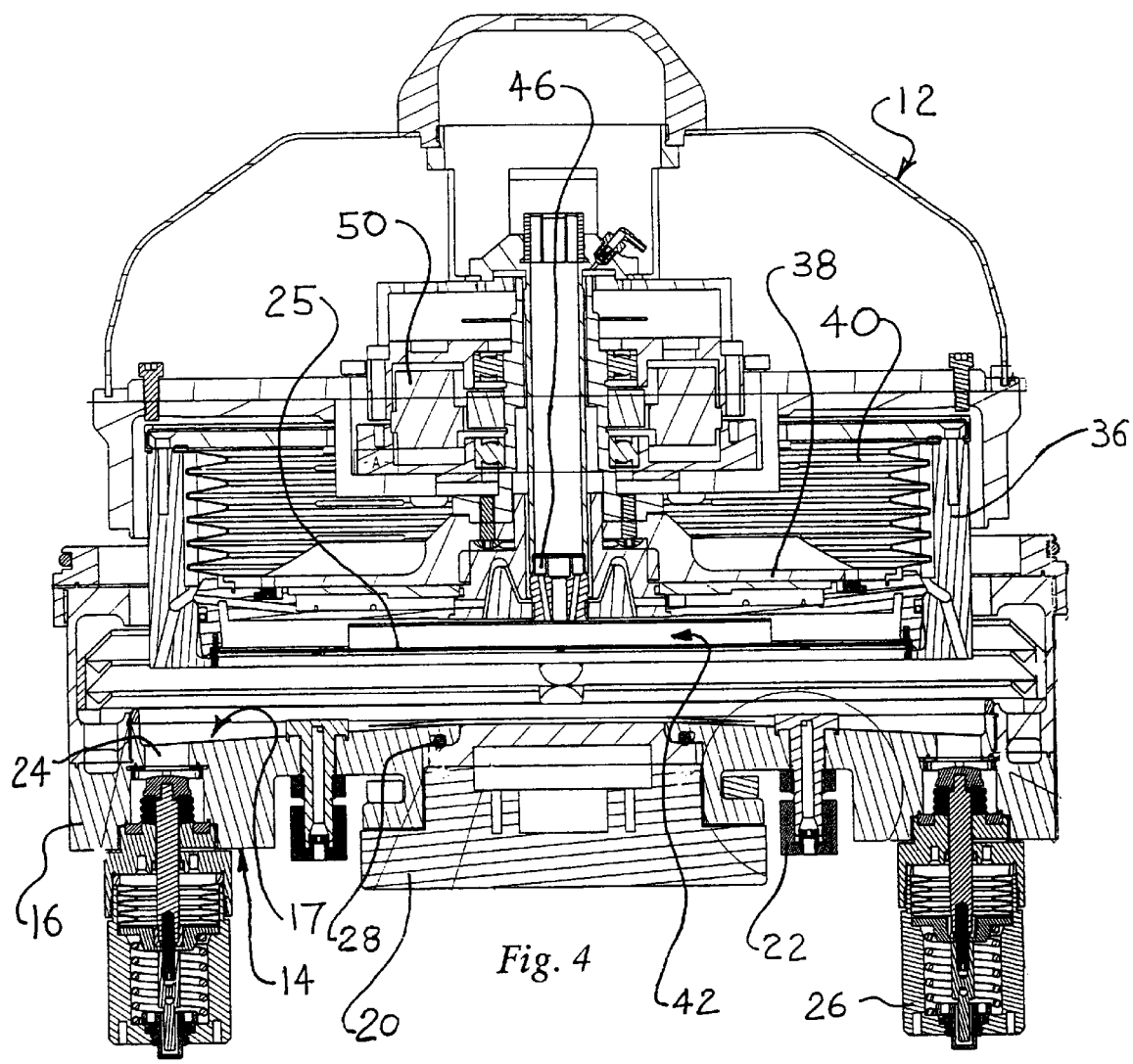
FIG. 4 is a section view taken along lines 4—4 of FIG. 1.

The base 14 includes a base plate 16. A sonic transducer 20, such as a megasonic transducer, is attached to or part of the base plate 16. The sonic transducer 20 is generally rectangular and is preferably centered on the spin axis of the head 12. As shown in FIG. 4., the sonic transducer is installed in a central opening in the base plate 16 and forms the central bottom section of a bowl or liquid holding vessel 17.

Figure 2:
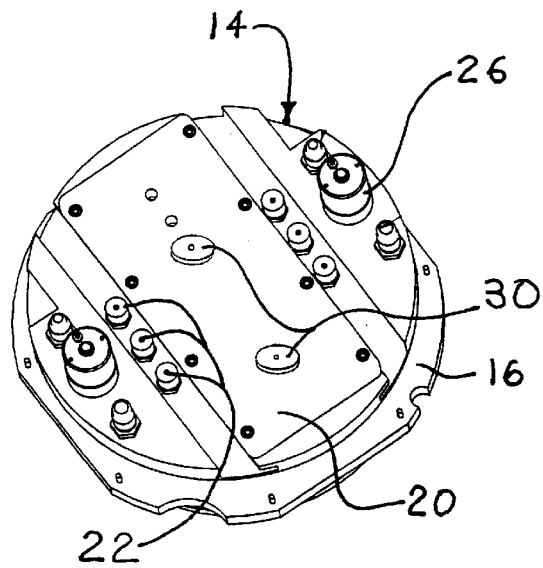
FIG. 2 is a perspective view of the underside of the base shown in FIG. 1.

Spray nozzles 22 extend through the base plate 16. As shown in FIG. 2, preferably, a series of spray nozzles 22 are provided on opposite sides of the sonic transducer 20, near the center of the process head 12. The spray nozzles are oriented to spray liquid at an angle towards the center of the workpiece 25. Flood nozzles or inlets 30 also extend through the base plate 16 into the bowl 17. The flood nozzles 30 are used to fill the bowl 17 with liquid, for liquid contact or immersion processing of the bottom or device side of the workpiece 25. The flood nozzles 30 may be provided in openings passing through the sonic transducer 20. Alternatively, the flood nozzles 30 may be positioned to one side of the transducer 20, adjacent to the spray nozzles 22. Drain outlets 24 extend from the bowl 17 to one or more drain valves 26. The sonic transducer 20 is sealed against the base plate 16 by an O-ring 28.

Figure 3:
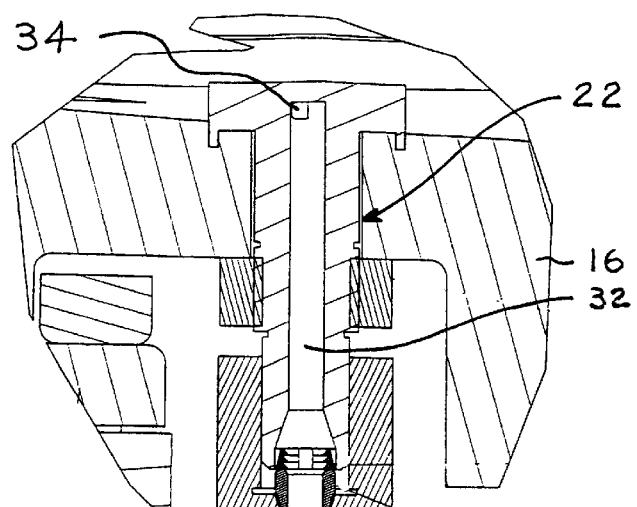
FIG. 3 is an enlarged section view of a spray nozzle shown in FIG. 2.

Referring to FIG. 3, each spray nozzle 22 preferably has a fluid tube 32 extending through a nozzle body 35. A directional opening 35 at the upper end of the fluid tube 32 directs a spray of fluid towards the lower surface of a workpiece on the process head 12 engaged to the base 14.

With the bowl 17 in the base 14 containing liquid and with a workpiece in the liquid, the transducer 20 is energized. Sonic energy from the transducer 20 travels through the liquid to the workpiece in contact with the liquid 22. The sonic energy assists and enhances processing. The spray nozzles 22 are used to spray liquid onto the bottom surface of the workpiece, for example, in a rinsing step, after the liquid in the bowl 17 has been removed, or drained to a low enough level to expose the spray nozzles 22. The motor 50 may rotate the workpiece while the workpiece is in contact with the liquid. Preferably, during processing, the flood nozzles 30 provide a continuous flow of liquid into and through the bowl 17. Liquid overflows over a drain weir 60 on the base and into a drain channel 62 which bypasses the drain valves 26 and connects into a drain line. This constant flow of liquid helps to carry potential contaminants away from the workpiece.

The present invention has been illustrated with respect to a wafer. However, it will be recognized that the present invention has a wider range of applicability. By way of example, the present invention is applicable in the processing of disks and heads, flat panel displays, microelectronic masks, and other devices requiring effective and controlled wet processing.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the inventions. The inventions therefore, should not be limited, except by the following claims, and their equivalents.

What is claimed is:

1. A system for processing a workpiece, comprising:
   a bowl for holding a liquid;
   a sonic energy source associated with the bowl for introducing sonic energy into a liquid in the bowl;
   a process head;
   a process head lifter positioned to move at least part of the process head into and out of liquid in the bowl, with the process head including an upper rotor and lower rotor, with the upper rotor and the lower rotor engageable around a workpiece.

2. The system of claim 1 further including a fill port and a drain port in the bowl.

3. The system of claim 1 further including an inlet in the upper rotor.

4. The system of claim 1 wherein the lower rotor comprises an annular ring.

5. The system of claim 4 wherein the lower rotor is moveable into a position where it substantially surrounds the sonic energy source.

6. The system of claim 1 wherein the sonic energy source comprises a sonic transducer.

7. The system of claim 6 wherein the transducer is fixed in place within the bowl.

8. The system of claim 7 wherein the transducer is aligned with the lower rotor.

9. The system of claim 1 further comprising one or more process liquid supply sources connected to the bowl.

10. The system of claim 9 wherein the process liquid supply sources contain a liquid selected from the group consisting of water, HF, and ozonated water, and a combination of them.

11. The system of claim 1 further comprising a motor connected at least indirectly to the upper rotor.

12. A system of claim 6 further including a liquid outlet nozzle positioned under an opening in the transducer.

13. The system of claim 6 further comprising a liquid outlet nozzle extending through an opening in the transducer.

14. A system for processing a workpiece comprising:
   a base including a recess for holding a liquid;
   sonic energy means for providing sonic energy into a liquid in the recess;
   a process reactor having an upper rotor engageable with a lower rotor;
   holding means for holding a workpiece between the upper rotor and the lower rotor; and
   lifting means for raising and lowering the process rotor.

15. A method for processing a workpiece, comprising:
   holding a workpiece between an upper rotor and a lower rotor;
   contacting the workpiece with a bath of liquid;

providing sonic energy into the bath of liquid; and rotating the workpiece.

16. The method of claim 15 further comprising the step of separating the workpiece from the bath, before rotating the workpiece.

17. The method of claim 15 further comprising the step of rotating the workpiece while the workpiece is in contact with the bath.

18. The method of claim 15 further comprising the step of contacting the workpiece with the bath by lowering the lower rotor into the bath.

19. The method of claim 15 wherein the bath comprises water, HF, or ozonated water.

20. The method of claim 17 further comprising the step of contacting a bottom surface of the workpiece with the bath and causing liquid from the bath to move onto a peripheral edge area of a top surface of the workpiece.

21. The method of claim 15 where the workpiece has a top surface and a bottom surface and where the bottom surface of the workpiece is contacted with the bath, further comprising the step of providing a fluid onto the top surface of the workpiece.

22. The method of claim 15 wherein the fluid is provided at a central area of the workpiece.

23. A system for processing a workpiece, comprising:

an upper rotor;

a lower rotor engageable with the upper rotor, to hold a workpiece between them;

a sonic transducer on at least one of the upper and lower rotors;

at least one fluid inlet in at least one of the upper and lower rotors; and at least one fluid outlet in at least one of the upper and lower rotors.

24. The system of claim 23 further comprising a tank for holding a liquid, and an actuator for lowering the lower rotor into the tank.

25. The system of claim 24 with the sonic transducer having a central through opening, and further comprising a nozzle outlet in the tank aligned with the central through opening.

26. The system of claim 23 further comprising a spin motor attached to the upper rotor.

27. The system of claim 23 further comprising means for attaching and releasing the upper rotor and the lower rotor.

28. The system of claim 24 further comprising a first process fluid source connected to the tank, and a second process fluid source connected to an outlet in the upper rotor.

29. The system of claim 24 further comprising means for rotating the lower rotor relative to the tank.

\* \* \* \* \*